United States Patent
Huang et al.

(10) Patent No.: US 10,048,722 B2
(45) Date of Patent: Aug. 14, 2018

(54) WEARABLE PORTABLE ELECTRONIC DEVICE WITH HEAT CONDUCTING PATH

(71) Applicant: AZTRONG INC., Rockville, MD (US)

(72) Inventors: Kung-Shiuh Huang, Orange, CA (US); Kuan-Tsae Huang, Rockville, MD (US); June Wu, North Potomac, MD (US)

(73) Assignee: AZTRONG INC., Rockville, MD (US)

( * ) Notice: Subject to any disclaimer, the term of this patent is extended or adjusted under 35 U.S.C. 154(b) by 0 days.

(21) Appl. No.: 14/515,111

(22) Filed: Oct. 15, 2014

(65) Prior Publication Data

US 2015/0029661 A1    Jan. 29, 2015

(51) Int. Cl.
| G06F 1/16 | (2006.01) |
| H01L 35/08 | (2006.01) |
| H01L 35/30 | (2006.01) |
| G06F 1/20 | (2006.01) |
| H05K 7/20 | (2006.01) |

(52) U.S. Cl.
CPC .............. G06F 1/163 (2013.01); G06F 1/203 (2013.01); H01L 35/08 (2013.01); H01L 35/30 (2013.01); H05K 7/205 (2013.01); G06F 1/1652 (2013.01)

(58) Field of Classification Search
CPC ...... H05K 1/0206; H05K 1/115; H05K 1/189; H05K 1/0201–1/0212; H05K 7/20954–7/20963; H05K 7/205; H01L 35/08; H01L 35/30; G06F 1/163; G06F 1/1652; G06F 1/133382; G06F 1/133385

USPC ............ 361/679.54, 704–723; 362/373, 218, 362/269, 294; 257/712–713; 174/252, 174/261–266; 165/80.2
See application file for complete search history.

(56) References Cited

U.S. PATENT DOCUMENTS

| 5,642,055 | A * | 6/1997 | Difrancesco | B23K 20/16 174/261 |
| 6,219,243 | B1 * | 4/2001 | Ma | H01L 23/36 257/706 |
| 8,338,940 | B2 * | 12/2012 | Yamazaki | H01L 23/4985 257/668 |
| 8,872,041 | B2 * | 10/2014 | Lee | H05K 1/186 174/250 |
| 2006/0292461 | A1 * | 12/2006 | Shives | G02F 1/133385 430/7 |
| 2009/0008140 | A1 * | 1/2009 | Fjelstad | H05K 1/189 174/260 |
| 2010/0096166 | A1 * | 4/2010 | Fjelstad | H05K 1/189 174/254 |
| 2011/0255250 | A1 * | 10/2011 | Dinh | G03B 15/03 361/749 |

(Continued)

OTHER PUBLICATIONS

Fast-heat-fast-food, Sherri Carmody, fast heat for fast food , Apr. 4, 2002.*

*Primary Examiner* — Dion R Ferguson
*Assistant Examiner* — Amir Jalali
(74) *Attorney, Agent, or Firm* — Ditthavong & Steiner, P.C.

(57) ABSTRACT

A wearable portable electronic device includes at least one energy module which further included thermoelectric materials which may convert heat to electric power. A plurality of heat spreader thermally and electronically contact to at least one wall of an enclosure of the wearable portable electronic device by using graphene layer.

7 Claims, 3 Drawing Sheets

(56) References Cited

U.S. PATENT DOCUMENTS

| | | | |
|---|---|---|---|
| 2012/0062571 A1* | 3/2012 | Malek | G06F 1/163 345/501 |
| 2013/0087180 A1* | 4/2013 | Stark | H01L 35/32 136/205 |
| 2014/0118931 A1* | 5/2014 | Hata | G06F 1/1626 361/688 |
| 2014/0139637 A1* | 5/2014 | Mistry | H04N 5/2252 348/46 |
| 2014/0218867 A1* | 8/2014 | Kim | H05K 9/0088 361/704 |
| 2014/0264820 A1* | 9/2014 | Hu | H01L 23/3736 257/713 |
| 2014/0268780 A1* | 9/2014 | Wang | F21V 19/003 362/249.06 |
| 2014/0328024 A1* | 11/2014 | Mataya | H05K 7/20454 361/720 |
| 2015/0382446 A1* | 12/2015 | Kwon | H05K 1/028 174/251 |

* cited by examiner

WEARABLE PORTABLE ELECTRONIC DEVICE WITH HEAT CONDUCTING PATH

BACKGROUND

Technical Field

The present disclosure relates to heat dissipation in flexible electronic devices. More specifically, the present embodiments related to an electronic device having a flexible housing and ultra-thin heat remover for the portable electronic devices with wearable technologies.

Background of the Invention

In recent years, wearable technologies become more and more important due to the demand of medical care, emergency requirement, childcare, and other personal monitors and reminders.

Wearable device usually contact to the user's body, therefore, required some specific designs to be able to meet the requirements such as heat sink to specific direction, flexibility, and light weight, etc.

According to the development of electronic devices to meet the high performance and multi tasks, the generation of heat in the circuit or circuit elements such as computer CPU, powered transistor, semiconductor, and other heat generator etc. are increasing drastically. Electronic devices may include housing, and a set of packed components which are packed within a limited size of housing. Powerful computer components allow the design and construction of higher performance portable computing devices. However, the use of such powerful computer components often results in increased heat generation by these computing devices. Therefore, improved heat dissipation technology or structure is often needed to maintain operating temperatures of the electronic devices within proper range.

The cooling of heat generating components of an electronic device is performed, in general, by attaching a heat sink to the heat generating component(s) and the heat sink is radiated or transferred heat by the airflow of an airflow generator.

The heat-dissipation mechanisms for electronic devices generally involve the use of extra materials and/or parts. For instance, heat spreader, cooling fans, vents, heat pipes may be employed to remove heat from components in an electronic device.

Hence, compact designs for portable electronic devices may be designed by components and/or materials to avoid hot spots near certain components such as a processor, display, and/or storage.

SUMMARY OF THE INVENTION

Many aspects of the embodiments related to techniques for spreading of heat throughout a computer system or efficiently expelling heat, depended on the environment or position of the device, to avoid overheat near certain components such as display, CPU, GPU, and other temperature sensitive components inside a compact electronic device. The portable electronic device comprises an energy module, at least one of a processor, power manage unit (PMU), at least one display module with transparent screen, at least one printed circuit board (PCB), at least one flexible printed circuit board (FPCB), at least one solid state disk (SSD), optional hard disk drive (HDD), at least one radio transceiver, and other components to work with the above components.

BRIEF DESCRIPTION OF THE FIGURES

The present invention is illustrated by way of example and not limitation in the figures of the accompanying drawing. The components in the drawings are not necessarily drawn to scale.

DETAILED DESCRIPTION

The disclosure is illustrated by way of example and not by way of limitation in figures of the drawings. It should be noted that references to "an" or "one" embodiment in this disclosure are not necessarily to the same embodiment, and such references mean at least one.

Graphene is pure carbon in the form of a very thin, nearly transparent sheet, one atom thick. It is remarkably strong for its very low weight (100 times stronger than steel) and it conducts heat and electricity with great efficiency.

Graphite is composed of layers of carbon atoms that are arranged in 6-membered, hexagonal rings. These rings are attached to one another on their edges. Layers of fused rings can be modeled as an infinite series of fused benzene rings (without the hydrogen atoms).

The following table shows the comparison of thickness for different materials.

|  | Graphene | Grapheme thermal film | Graphite |
|---|---|---|---|
| Thickness (um) | 1-100 nm | >10 | 25-200 |

A graphene layer disclosed in the embodiments is ranged in 1-5 nm, 1-20 nm, 20-30 nm, 5-100 nm, and/or less than 1 mm.

Figure 1:
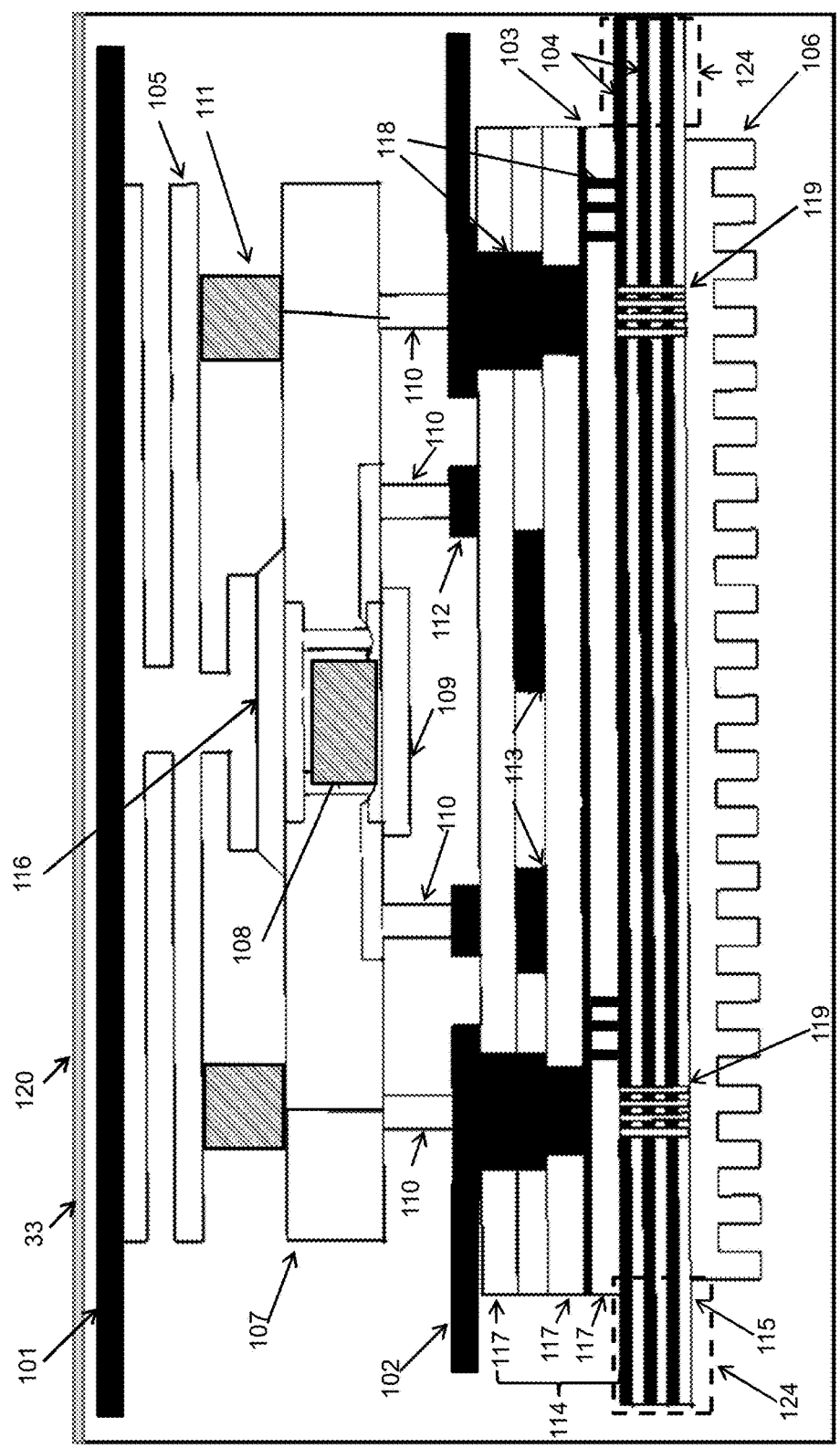
FIG. 1 shows a partial perspective view of a package with heat sink of an electronic device according to the invention.

FIG. 1 shows the overview of the circuit board arrangement of a flexible portable electronic device.

The portable electronic device may correspond to a wrist-worn device, tablet, laptop, personal digital assistant (PDA), medial player, mobile phone, digital camera/camcorder, and/or any battery-powered electronic device.

Figure 2:
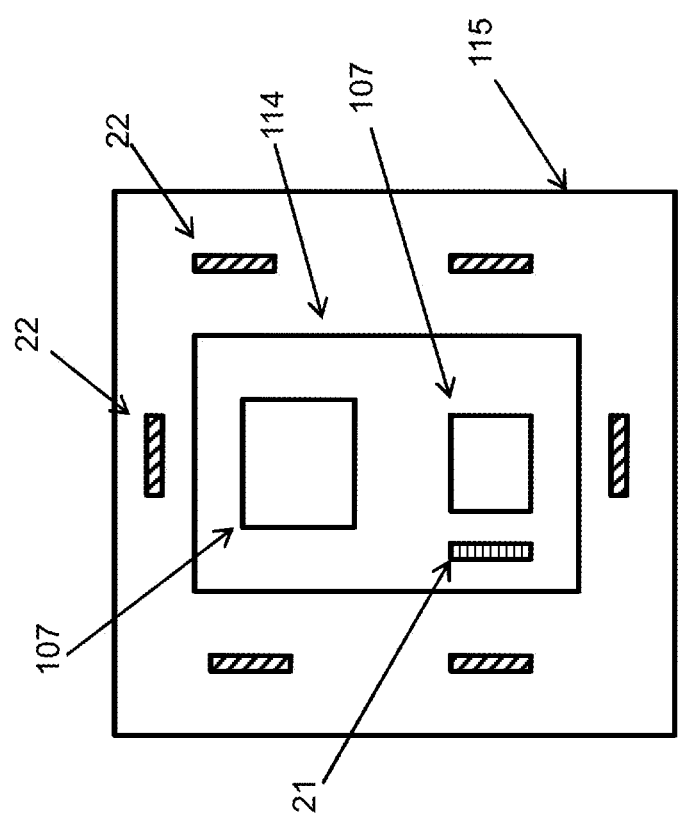
FIG. 2 shows a partial perspective view of the circuit boards arrangement of the electronic device of FIG. 1 with internal components.

Referring to FIG. 1 and FIG. 2, the internal arrangement of the portable electronic device 31 may comprise a flexible top wall 33 with a display module 120, wherein the display module 120 comprising a transparent screen and at least one heat generating component, at least one printed circuit board (PCB) 114, comprising at least one signal layer and at least one isolation layer 117, at least one flexible printed circuit board (FPCB) 115, at least one package 107 with die 108, a first graphene layer 101, a second graphene layer 102, at least one PCB 114 graphene layer 103, at least one FPCB graphene layer 104, a first heat conduct 105 for the package 107, cap 109, external connector 111, PCB pad 21, FPCB pad 22, and a second heat conduct 106 for the package 107.

The package 107, as shown in this illustrative embodiment, comprises a top heat conducting zone 116 which spreads the heat from the package 107 to the first heat conduct 105. The first heat conduct 105 is implemented as a rigid structure and may further thermally connect to the first graphene layer 101, with flexibility which may be bendable more than 90 degree up to 180 degree, and eventually remove the heat from the portable electronic device enclosure, or housing 32, through the first graphene layer 101.

On the other side of the package 107 which facing the circuit board (PCB, or FPCB), as shown in the FIG. 1, further comprises connector pins 110 which physically and/or electronically connect between the package 107 and pads 112 on the surface of the circuit board (PCB 114, or FPCB).

Referring again to FIG. 1, the PCB 114 further comprises at least one insulation layer, at least one signal layer which included signal traces 113 transferring the signals on board. There is at least one pad 112, on the surface of the PCB 114, further connect to the second graphene layer 102 and at least one on-board via 118/119. The at least one on-board via 118/119, connected to the second graphene layer 102, further thermally and electrically connects to a ground layer, which comprises graphene, inside the PCB 114 and allows for carrying signal, or noise, and spreading the heat.

The PCB 114, as discussed and illustrated in FIG. 1, is arranged on a surface of the FPCB 115 with connections of signals, ground plan, and/or heat conduct through a plurality of vias 118/119. The FPCB 115 comprises at least one layer included graphene which provides the hear conduction, through vias, between the PCB 114 and at least one second heat conduct 106 located on the opposite side of the FPCB 115. As shown in FIG. 1, the at least one layer included graphene may further conducts the heat in a horizontal direction out of area covered by the package 107. This heat conduction path provided the possibility to further remove the heat to the other structure/components, such as housing 32, another graphene layer, another PCB/FPCB structure, a display module, an energy module, an energy module comprising thermoelectric materials as a submodule, which converts heat to electrical energy (and the reverse) with no moving parts, etc.

FIG. 2 shows a zoom-out view of the illustrated embodiment wherein the FPCB 115 may further extend on at least one side of the PCB 114, forming at least one extended portion 124. The FPCB 115 may further comprise at least one connector (or pad) which may connect the other components or the key/button on the housing 32. The PCB 114, on the other hand, mainly provides a rigid platform for the electronic components on top of it. At least one connector (or pad 112) may located on the PCB 114 which may connect the other components or the key/button on the housing 32.

Figure 3:
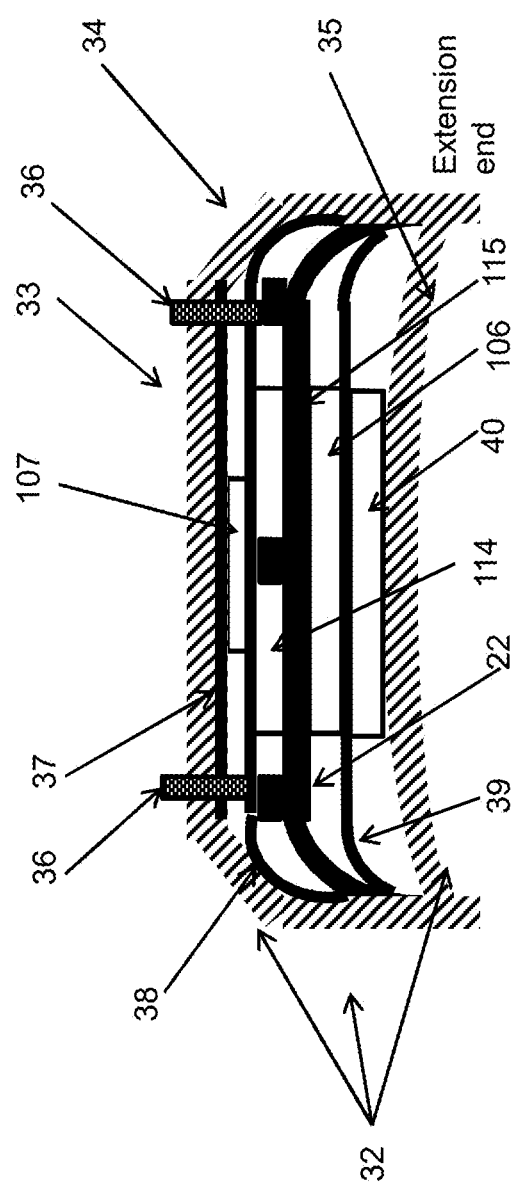
FIG. 3 shows another cross-section view of the electronic device of FIG. 1 with housing. In order to illustrate this configuration clearly, some detail internal components are not shown.

FIG. 3 shows a cross sectional view of an embodiment of the invention. The portable electronic device comprises a flexible top wall 33 with display module which may be a touch screen and/or with key/button 36 for user input. The flexible top wall 33 further comprises heat conduct materials included metal, graphene/graphite, plastic, and/or combination of some of these materials. Therefore, these materials can maintain their shapes with flexibility and provide heat conducting function by using materials included highly heat conduct metals such as metal, graphene, and/or graphite. The flexible top wall 33 may further comprise at least one first graphene layer 101 on the inner surface. Therefore, the heat spreader on top of another electronic module, FPCB 115 or PCB 114 module can thermally contact with the at least one first graphene layer 101 and further remove the heat to the environment.

The flexible top wall 33 further connects to at least one flexible side wall 34 which is bendable more than 90 degree up to 180 degree. The flexible side wall 34 further comprises heat conduct materials included metal, graphene/graphite, plastic, and/or combination of some of these materials. Therefore, these materials can maintain their shapes with flexibility and provide heat conducting function by using materials included highly heat conduct metals such as metal, graphene, and/or graphite. The flexible side wall may further comprise at least one second graphene layer 102 on the inner surface. Therefore, the heat spreader on a top or side of another electronic module, FPCB 115 or PCB 114 module can thermally contact with the at least one second graphene layer 102 and further remove the heat to the environment.

Referring again to FIG. 3, the portable electronic device further comprises a flexible bottom wall 35 which may thermally connects to an energy module, the energy module comprising thermoelectric materials as a submodule, which converts heat to electrical energy (and the reverse) with no moving parts. Because the energy module with thermoelectric materials is sandwiched between the second heat conduct 106 which connected to a PCB/FPCB module with heat generator and the flexible bottom wall 35, this energy module may receive the collected heat and convert to electrical energy which may story in the energy module comprising battery calls.

By using the graphene layer(s) as flexible heat spreader between the second heat conduct 106 and the energy module, the gap between the second heat conduct 106 and the energy module can be limited to the thickness of the graphene layer(s) which range from 1 nm to 1 mm as discussed.

All the display modules, as disclosed in this invention, may be a touch screen with user input function, such as touch screen keyboard. Therefore, allows for typing the data through the display module.

The at least one heat generating component may be semiconductor chip, radio frequency (RF) chip, data storage, and/or other electronic components.

The operation of portable electronic device may generate heat with usage of the heat generating components as discussed in above paragraphs. This may results in an increase in the temperature(s) of the components. For instance, the user operations on the portable electronic device may cause the central processing unit (CPU) and associated chips of the device to heat up. Therefore, the local temperature(s) buildup may cause injury to a user. In addition, the electronic components/parts may lose reliability, and/or fail prematurely.

Therefore, the portable electronic device may include structures for removing heat from the components inside the portable electronic device.

Because heat-dissipation materials may take up space within the portable electronic device and may also increase the material and assembly costs for portable electronic device. A heat remover/spreader may be flexible and comprising at least one layer of graphite may be positioned over the surface of the first energy module or the second energy module, or both of the first energy module and the second energy module. A heat remover/spreader comprising at least one layer of graphite may be positioned in thermal contact with circuit board and/or at least one heat generating component inside the portable electronic device to allow heat generated by the at least one heat generating component to spread to the at least one energy module, the airflow generator, the enclosure of the portable electronic device, and/or a top layer of the display module. The thickness of the at least one layer of the graphite/graphene/thermal film is as discussed in previous paragraph.

A first heat conduction means thermally connected between the first heat conduct 105 and the inner wall of the housing 32 with a first flexible heat spreader 37 comprising graphene. In addition, the first heat conduction has the direction of the heat conduction from the first heat conduct 105 to the inner wall of the housing 32.

A second heat conduction means thermally connected between a contact area where the package 107, circuit board and the second flexible heat spreader 38 comprising graphene are thermally connected and the inner wall of the housing 32 included top wall and at least one side wall. In addition, the second heat conduction has the direction of the heat conduction from the contact area to the inner wall of the housing 32 included top wall and at least one side wall.

A third heat conduction means thermally connected from the at least one PCB graphene layer 103 or the FPCB 115 graphene layer 104, or both, to the inner wall of the housing 32 included top wall and at least one side wall. In addition, the third heat conduction has the direction of the heat conduction from the PCB graphene layer 103 or the FPCB graphene layer 104, or both, to the inner wall of the housing 32 included top wall and at least one side wall.

A fourth heat conduction means thermally connected from a contact area there the second heat conduct, the third flexible heat spreader 39, and the energy module 40 are thermally connected, to the inner wall of the housing 32 included top wall and at least one side wall. In addition, the fourth heat conduction has the direction of the heat conduction from the second heat conduct to the energy module 40, or (optional) to the inner wall of the housing 32 included top wall and at least one side wall.

As discussed above, the flexible heat spreaders maybe composed of graphene. The flexible heat spreaders may be disposed over a surface of any energy module 40 and/or a surface of any heat generating component by attaching a monolayer of graphene onto the surface of the surface of any energy module 40 and/or the surface of any heat generating component.

Furthermore, the use of graphene in the heat remover/spreader may reduce the amount of space occupied by the heat remover/spreader very significantly while providing highly effective dissipation of heat from heat generator or heat source. The thermal conductivity of graphene near room temperature may range from $4.8\pm0.5\times10^3$ to $5.3\pm0.5\times10^3$ $Wm^{-1}$ $K^{-1}$, which is obvious better than other materials like graphite, copper, carbon nanotube and/or diamond. Therefore, heat remover may remove heat away from any heat generator/source more effectively than any known material, included graphite, copper, carbon nanotube and/or diamond. Using graphene will increase reliability, safety, and performance during use of the portable electronic device.

In addition, the character of high tensile strength of graphene may results in a graphene monolayer less than one nanometer thickness to be used as heat remover/spreader compared to other heat spreader materials which may range in thickness from tens of microns to a millimeter scale. Consequently, as discussed above, the reduction in thickness/space sized by heat remover may results in a decrease in the portable electronic device's size/thickness and an increase in the portable electronic device's portability or design attractiveness. On the other hand, the extra space savings may increase the size of the energy module 40; add more components to the portable electronic device, therefore, further improve the functionality or operation hours of the portable electronic device.

The process of facilitating the use of flexible heat spreaders comprising graphene in a portable electronic device in accordance with the disclosed embodiment(s) comprising:

First, the circuit board and/or display module with at least one heat generating component are arranged within an enclosure of the portable electronic device. Then, the at least one energy module 40 is arranged closed to the at least one heat generating component. The at least one heat generating component may include a CPU, a graphic process unit (GPU), a PSU, a PCB, a RF components, a data storage such as SSD, HDD, or RAM, a backlight, a LED, a charging circuit, a signal circuit.

The energy module 40 may correspond to a lithium-ion, solid-state or lithium-polymer battery, and/or thermoelectric materials which can convert the heat to electrical energy (and the reverse) with no moving parts.

Second, the flexible heat spreaders comprising graphene is disposed over a surface of the energy module 40 allowing heat transfers in either way. The graphene may be grown on a substrate and/or exfoliated from graphite. Then, the graphene is pressed onto the surface of the energy module 40. A adhesive material may be applied between the heat remover and the surface of the energy module 40.

Third, the flexible heat spreaders comprising graphene is applied to the at least one of the heat generating component with thermal contact. Therefore, the flexible heat spreaders may be extended over the battery onto the surface of a circuit board. With this arrangement step, the flexible heat spreaders may transfer heat from the components to the energy module 40 and/or other parts/components of the portable electronic device. As a result, the temperature of the energy module 40 may increase and further extend runtime of the energy module 40 which may include solid-state battery as discussed above.

The disclosed flexible heat spreaders can be used in any type of electronic comprising data processor (CPU, GPU, PSU, PMU), a storage (RAM, SSD, etc.), a display, and energy module which provides power and/or convert heat to power. The portable electronic device may correspond to a wrist-worn device, tablet, laptop, personal digital assistant (PDA), medial player, mobile phone, digital camera/camcorder, and/or any battery-powered electronic device. Energy module may correspond to a battery pack included one or more battery cells along with a thermoelectric materials. The flexible heat spreaders comprising graphene may be disposed over a contact surface of the energy module (included thermoelectric materials) and in thermal contact with the at least one of the heat generating component (as discussed above) of the portable electronic device. The flexible heat spreaders may transfer heat from the at least one components to the energy module and/or other portion of the portable electronic device.

While certain embodiments have been described and shown in the accompanying drawings, it is to be understood, even though information as to, that such embodiments are merely illustrative and not restrictive of the current invention, and this invention is not restricted to the specific constructions and arrangements shown and described since modifications may apply to those ordinarily skilled in the art. Additionally, changes may be made in detail, especially in the matters of size, shape, and arrangement of parts within the present embodiments to the full extend indicated by the broad general meaning of the terms in which the appended claims are expressed.

What is claimed is:

1. A portable electronic device, comprising:

a housing comprising a flexible top wall, a flexible bottom wall opposite to the flexible top wall, and at least one flexible side wall which is bendable for more than 90 degree; and a circuit board comprising at least one heat generating component on at least one side of the circuit board, wherein a first rigid heat conduct thermally connects to the at least one heat generating component; and wherein the flexible top wall comprises a display module, wherein the display module comprises a transparent screen, and wherein the display module generates image and displays through the transparent screen; and a first flexible heat spreader physically connects to the first rigid heat conduct and the flexible top wall; and a flexible circuit board located on a side of the circuit board opposite to the first rigid heat conduct, wherein the flexible circuit board comprises a second rigid heat conduct located on a side of the flexible circuit board opposite to the circuit board;

the at least one heat generating component on the circuit board comprising at least one pad; and the at least one pad, the circuit board, the flexible circuit board, the second rigid heat conduct are thermally and electrically connected through at least one via.

2. The portable electronic device of claim 1, wherein an energy module comprising thermoelectric materials which converts heat to electrical energy is sandwiched and thermally connected between a second flexible heat spreader and a surface of the flexible bottom wall.

3. The portable electronic device of claim 1, wherein a connector is located on a surface of the flexible circuit board and further connected to a button or a key on top of the flexible top wall.

4. The portable electronic device of claim 1, wherein a second flexible heat spreader comprising graphene thermally and electrically connect from a surface of the circuit board comprising at least one pad to an inner surface of the housing.

5. The portable electronic device of claim 1, wherein a third flexible heat spreader comprising graphene which is sandwiched between two layers of the flexible circuit board and thermally and electrically connects between the circuit board and an inner surface of the housing through a plurality of vias.

6. The portable electronic device of claim 1, wherein the flexible circuit board covers a bottom side of the circuit board and further extends on at least one side of the circuit board in a horizontal direction, forming at least one extended portion.

7. The portable electronic device of claim 6, wherein an end of the at least one extended portion further thermally and electrically connects to an inner side wall of the portable electronic device.

* * * * *